US011330738B1

(12) United States Patent
Refai-Ahmed et al.

(10) Patent No.: US 11,330,738 B1
(45) Date of Patent: May 10, 2022

(54) FORCE BALANCED PACKAGE MOUNTING

(71) Applicant: XILINX, INC., San Jose, CA (US)

(72) Inventors: Gamal Refai-Ahmed, Santa Clara, CA (US); Chi-Yi Chao, New Taipei (TW); Huayan Wang, Campbell, CA (US); Suresh Ramalingam, Fremont, CA (US); Volker Aue, Dresden (DE)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 17/133,525

(22) Filed: Dec. 23, 2020

(51) Int. Cl.
*H05K 7/20* (2006.01)
*H05K 1/02* (2006.01)
*H01Q 1/00* (2006.01)

(52) U.S. Cl.
CPC ........... *H05K 7/2049* (2013.01); *H01Q 1/002* (2013.01); *H05K 1/0204* (2013.01); *H05K 1/0209* (2013.01); *H05K 1/0243* (2013.01)

(58) Field of Classification Search
CPC ........ H05K 7/2049; H01L 23/40–4012; H01L 2023/4081–4087
See application file for complete search history.

(56) References Cited

U.S. PATENT DOCUMENTS

| | | | |
|---|---|---|---|
| 5,406,698 A | 4/1995 | Lipinski | |
| 5,825,087 A | 10/1998 | Iruvanti et al. | |
| 6,046,905 A * | 4/2000 | Nelson | G06F 1/186 |
| | | | 361/704 |
| 6,381,136 B1 * | 4/2002 | Nelson | H05K 7/20 |
| | | | 361/704 |
| 6,437,437 B1 | 8/2002 | Zuo et al. | |
| 6,437,438 B1 | 8/2002 | Braasch | |

(Continued)

FOREIGN PATENT DOCUMENTS

CN     113113378 A   *  7/2021   ......... H01L 23/3672

OTHER PUBLICATIONS

Ventola, L. et al., "Micro-structured rough surfaces by laser etching for heat transfer", Journal of Physics: Conference Series 525 (2014) 012017, Eurotherm Seminar 102: Thermal Management of Electronic Systems, IOP Publishing, 10 pgs., retrieved Mar. 21, 2017 from URL:http://iopscience.iop.org/article/10.1088/1742-6596/525/1/012017/pdf.

(Continued)

*Primary Examiner* — Robert J Hoffberg
(74) *Attorney, Agent, or Firm* — Patterson + Sheridan, LLP (57) ABSTRACT

An electronic device is provided that balances the force applied to temperature control elements such that stress within components of the electronic device can be effectively managed. In one example, an electronic device is provided that includes a printed circuit board (PCB), a chip package, a thermal management system, a thermal spreader, and first and second biasing members. The chip package is mounted to the PCB. The thermal management system and spreader are disposed the opposite of the chip package relative to the PCB. The first biasing member is configured to control a first force sandwiching the chip package between the thermal spreader and the PCB. The second biasing member is configured to control a second force applied by the thermal management system against the thermal spreader. The first force can be adjusted separately from the second force so that total forces applied to the chip package and PCB may be effectively balanced.

18 Claims, 7 Drawing Sheets

(56) References Cited

U.S. PATENT DOCUMENTS

| | | | |
|---|---|---|---|
| 6,607,942 | B1 | 8/2003 | Tsao et al. |
| 7,491,577 | B2 | 2/2009 | Sturcken et al. |
| 8,437,137 | B2* | 5/2013 | Lee .................... H01L 23/4006 |
| | | | 361/719 |
| 9,287,141 | B2 | 3/2016 | Dahlstrom |
| 9,418,909 | B1 | 8/2016 | Chaware et al. |
| 9,812,374 | B1 | 11/2017 | Refai-Ahmed et al. |
| 10,043,730 | B2 | 8/2018 | Refai-Ahmed et al. |
| 10,147,664 | B2* | 12/2018 | Refai-Ahmed ....... H01L 23/433 |
| 10,262,920 | B1 | 4/2019 | Refai-Ahmed et al. |
| 11,133,238 | B2* | 9/2021 | Wu .................... H01L 23/4006 |
| 11,133,239 | B2* | 9/2021 | Mao ........................ G06F 1/183 |
| 2006/0227510 | A1 | 10/2006 | Fitzgerald et al. |
| 2006/0238984 | A1 | 10/2006 | Belady et al. |
| 2008/0274349 | A1 | 11/2008 | Chiu et al. |
| 2013/0168844 | A1 | 7/2013 | Stanley et al. |
| 2014/0264820 | A1 | 9/2014 | Hu et al. |
| 2015/0279761 | A1 | 10/2015 | Bet-Shliemoun |
| 2021/0045254 | A1* | 2/2021 | Zhang ...................... H05K 1/18 |

OTHER PUBLICATIONS

Conard Corporation, "Photo Etching PCB Heatsinks", retrieved Mar. 21, 2017 from URL: http://www.conardcorp.com/photo-etched-heatsinks.

* cited by examiner

FORCE BALANCED PACKAGE MOUNTING

TECHNICAL FIELD

Embodiments of the present invention generally relate to force balancing techniques for mounting chip packages to printed circuit boards in electronic devices. In some implementations, the electronic devices are beneficially embodied in antenna assemblies.

BACKGROUND

As wireless communications evolve from 4G to 5G mobile networks, massive-element antenna assemblies have been employed to enable network transmissions at ultra-high speeds with ultra-low latency. However, massive-element antennas generate large amounts of heat within the antenna assembly due to the increased power consumption associated with the large number of analog devices present within the antenna assembly. To compensate for the increased heat associated with the increase in power, larger thermal management systems acting as a thermal management systems and thermal spreaders can be utilized to dissipate the large heat load generated by integrated circuit (IC) dies of the chip packages utilized within the antenna assembly.

The current challenge of thermally coupling the thermal management system is managing the combined force utilized to ensure good thermal contact between the thermal spreader and cooling plate, and the force utilized to ensure good thermal contact between the thermal spreader and IC die of the chip package. This large combined force is transmitted to printed circuit boards, IC dies and/or substrates of the chip package utilized within the antenna assembly, causing stress that contributes to solder connection and routing failures.

Thus, there is a need for improved techniques for mounting chip packages to printed circuit boards capable of efficiently handle force loads.

SUMMARY

An electronic device is provided that balances the forces applied to temperature control elements such that stress within components of the electronic device can be effectively managed. In one example, an electronic device is provided that includes a printed circuit board (PCB), a chip package, a thermal management system, a thermal spreader, and first and second biasing members. The chip package is mounted to the PCB. The thermal management system and spreader are disposed the opposite of the chip package relative to the PCB. The first biasing member is configured to control a first force sandwiching the chip package between the thermal spreader and the PCB. The second biasing member is configured to control a second force applied by the thermal management system against the thermal spreader. The first force can be adjusted separately from the second force so that total forces applied to the chip package and PCB may be effectively balanced.

In another example, an electronic device is provided that includes a printed circuit board (PCB), a chip package, a thermal management system, a thermal spreader, a bracket, and a plurality of first and second biasing members. The chip package is mounted to the PCB. The thermal management system and spreader are disposed the opposite of the chip package relative to the PCB. The bracket is disposed in contact with the PCB and has a first portion aligned over the chip package and a second portion disposed laterally outward of the chip package. The first biasing member are disposed freely through the PCB and engaged with the second portion of the bracket and the thermal spreader. The first biasing member are configured to apply a first force sandwiching the chip package between the thermal spreader and the PCB. The second biasing member are engaged between the thermal management system and the PCB. The second biasing member are configured to control a second force applied by the thermal management system against the thermal spreader. The first force can be adjusted separately from the second force so that total forces applied to the chip package and PCB may be effectively balanced.

In yet another example, an electronic device is provided that includes an antenna array, a radome, a printed circuit board (PCB), a chip package, a thermal management system, a thermal spreader, and a plurality of first and second biasing members. The chip package has a conductive primary heat dissipation path through the thermal spreader to the thermal management system. The radome is disposed over the antenna array and forms part of a housing that encloses the antenna array and the chip package. The plurality of first biasing member are disposed freely through the PCB and engaged with the thermal spreader. The plurality of first biasing member are configured to apply a first force sandwiching the chip package between the thermal spreader and the PCB. The plurality of second biasing member are engaged between the thermal management system and the PCB. The second biasing member are configured to control a second force applied by the thermal management system against the thermal spreader. The first force can be adjusted separately from the second force so that total forces applied to the chip package and PCB may be effectively balanced.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements of one embodiment may be beneficially incorporated in other embodiments.

DETAILED DESCRIPTION

Examples of electronic and photonic devices are provided that balance forces applied to temperature control elements such that stress within components of the electronic device can be effectively managed. Although the exemplary electronic device is described below in the form of an antenna assembly, the techniques described herein may be applied to controlling the forces applied between integrated circuit dies and printed circuit boards in electronic devices other than an antenna assembly so that stress may be more effectively controlled, thus promoting increased reliability and performance of the electronic device incorporating the chip package.

In particular, the electronic devices described herein utilize to separate biasing members that are engaged with a printed circuit board (PCB) to control the force applied to temperature control elements, such as thermal management systems, thermal spreaders and the like. At least one first biasing member is engaged with the PCB and a thermal spreader. The first biasing member is configured to control the force that sandwiches a chip package between the PCB and the thermal spreader. Additionally, at least one second biasing member is engaged with the PCB and a thermal management system. The second biasing member is configured to control the force that holds the thermal management system against the thermal spreader. As the force generated by the first and second biasing members may be independently controlled, the force applied to the thermal spreader by the thermal management system may be adjusted independently from the force applied between the thermal spreader and the chip package. Thus, as the force ultimately applied to the chip package by the first and second biasing members may be balanced to ensure that the solder connections are not damaged by stress applied to the chip package and the chip package components, beneficially resulting in a robust and reliable electronic device.

Further, the balanced force application allows thermal management systems and the thermal spreaders to more effectively provide enhanced temperature management of solid state components within the electronic devices, and in particular, electronic devices like an antenna assembly. The thermal management system may be configured with passive cooling integrated in the form of one or more heat pipes. The heat pipes are arranged to transfer heat laterally away from the integrated circuit (IC) dies disposed within the antenna assembly so that heat may be dissipated more efficiently across a greater area of the thermal management system. Advantageously, the efficient heat dissipation allows the use of a large number electrical components within the antenna assembly, thus enabling greater processing speeds and ultra-low latency without the need for large thermal management systems as would be required in conventional devices. Thus, the efficient thermal management enables robust and reliable performance of massive-element antennas utilized by next generation (e.g., 5G) mobile communication devices without a corresponding need for increase antenna assembly footprint or cost. Moreover, the improved thermal management of the active components and circuits of the antenna assembly allow for a more compact antenna design, thus enabling a smaller and more desirable antenna footprint, while making cooling simpler and improving the service life.

Figure 1:
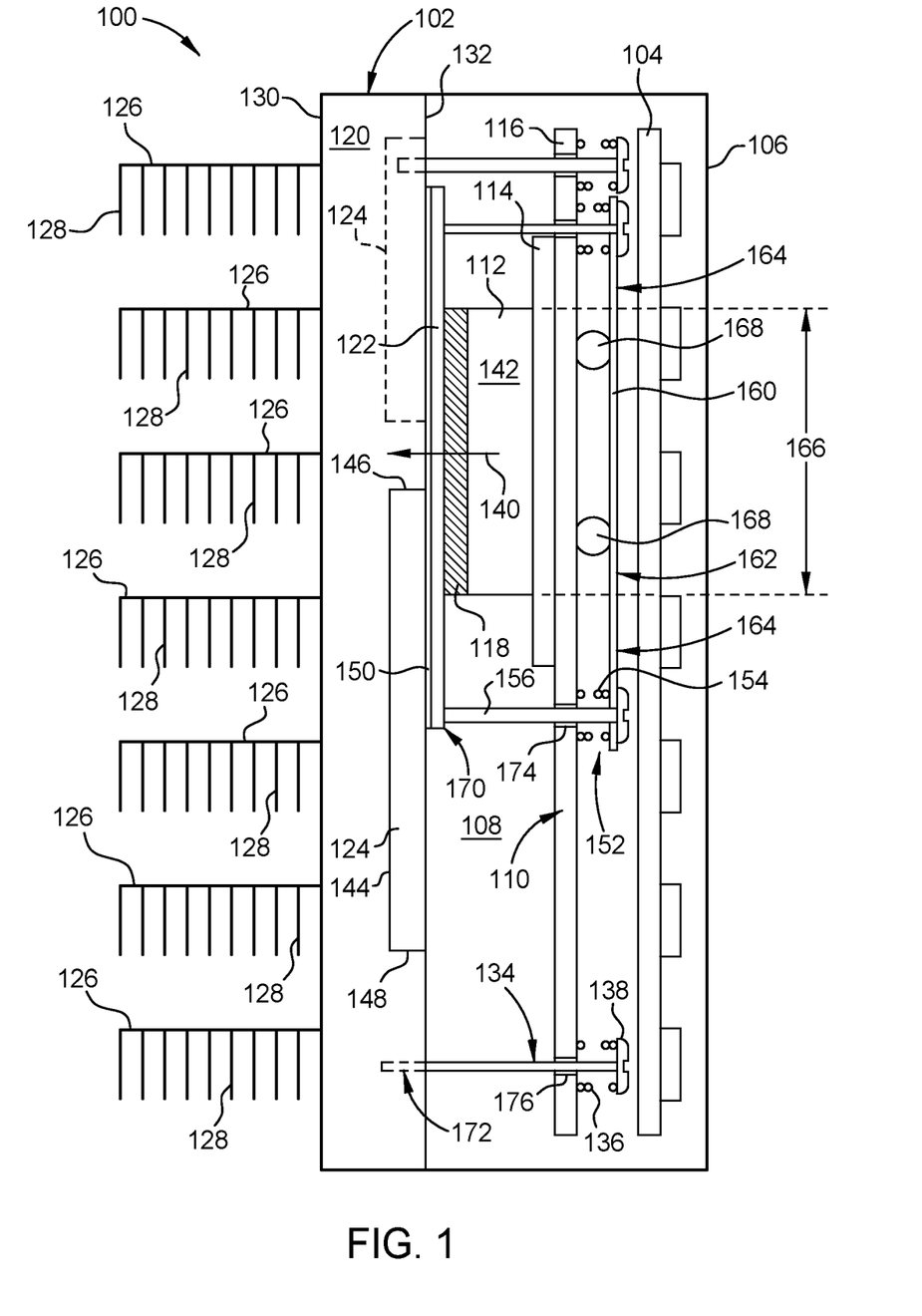
FIG. 1 is a schematic sectional view of an electronic device having a chip package interfaced with force balanced temperature control elements.

Turning now to FIG. 1, a schematic sectional view of one example of an electronic device 100. As mentioned above, the electronic device 100 is illustrated by way of example and not by way of limitation as an antenna assembly. It is to be understood that the techniques described herein for controlling the forces applied between integrated circuit dies and printed circuit boards so that stress may be more effectively controlled may be utilized in essentially any electronic device having thermal management systems and the thermal spreaders, even if not configured as an antenna assembly. The force balancing of the temperature control elements promote increased reliability and performance of the electronic devices 100 by reducing stress that is detrimental to solder interconnects and routing with the chip package(s) utilized in the electronic device 100.

The electronic device 100 includes a thermal management system 102 configured to function as a heat sink, a thermal spreader 122, a chip package 142, at least one first biasing member 152 and at least one second biasing member 134. The first biasing member 152 is configured to control a force applied between an integrated circuit (IC) die 112 of the chip package 142 and the thermal spreader 122. The IC die 112 may be a logic die, memory die, photonic die or other type of solid state circuitry disposed within a chip. The first biasing member 152 is configured to control a force applied between the thermal management system 102 and the thermal spreader 122. As the forces applied by the first and second biasing members 134, 152 may be independently controlled and adjusted, the forces applied to the chip package 142 may be more effectively controlled to enhance the reliability and performance of the chip package 142, and ultimately the electronic device 100.

As the electronic device 100 illustrated in FIG. 1 is shown as an antenna assembly, the electronic device 100 will be referred as the antenna assembly with reference numeral 100 (e.g., antenna assembly 100) in the examples described below.

The thermal management system 102 of the antenna assembly 100 may optionally be configured with one or more passive temperature control elements that enhance the heat transfer capacity of the thermal management system 102 with little significant impact to the overall size and weight of the antenna assembly 100. The enhanced heat transfer capacity allow for a compact and lightweight antenna assembly, which is particularly beneficial for massive-element antenna assemblies that enable ultra-high speed, ultra-low latency network transmissions.

In addition to the thermal management system 102, the antenna assembly 100 also includes a radome 106, an antenna array 104 and an antenna circuit board 110. The radome 106 is sealingly coupled to the thermal management system 102, forming a sealed interior volume 108 in which the antenna array 104 and the antenna circuit board 110 are disposed. The thermal management system 102 includes an exterior surface 130 and an interior surface 132. The exterior surface 130 thermal management system 102, along with the exterior surface of the radome 106 provide the weather protection for the antenna assembly 100, thus protecting the antenna array 104 and the antenna circuit board 110 disposed in the interior volume 108 from the harsh elements of the outside environment.

The radome 106 is generally fabricated from a material suitable for outdoor use and has a suitable radio frequency (RF) transmission properties, while providing sufficient structural rigidity to inhibit excessive deflection due to wind loading. Suitable materials include, but are not limited to, glass reinforced plastics, thermoplastic compounds, fiberglass, and UV stabilized plastics, such as outdoor grade polyvinyl chloride (PVC).

The antenna array 104 is disposed within the interior volume 108 adjacent to the radome 106. The antenna array 104 may be coupled to either the thermal management system 102 or the radome 106, for example by fasteners or clips. In one example, the antenna array 104 is coupled to the radome 106 utilizing a plurality of fasteners.

The antenna array 104 includes a plurality of connectors (not shown), which are configured to couple with one end of an RF connector. The RF connector may be a coaxial cable or other suitable board-to-board connector. The RF connector may be a bullet adapter, such as available from Amphenol RF, that are configured to couple a plurality of connectors of the antenna circuit board 110 with the plurality of connectors of the antenna array 104. The bullet adapter allows the radome 106 to be assembled and mounted to the thermal management system 102 while providing tolerance for good and reliable communication between the antenna circuit board 110 and the antenna array 104 through the RF connector.

An optional RF shield (not shown) may also be disposed between the antenna array 104 and the antenna circuit board 110. The RF shield is configured to reduce or block the transfer of radio frequency electromagnetic radiation between the antenna array 104 and the antenna circuit board 110. The RF shield is fabricated from conductive or magnetic materials to form a Faraday cage. Although not shown, the RF shield is coupled via a conductor to the ground of the antenna assembly 100.

The antenna array 104 generally includes a radiating surface and a backside surface. The backside surface generally faces the antenna circuit board 110. The radiating surface has the radiating elements mounted thereon. In one example, radiating elements are arranged in an 8×8 array on the radiating surface. The radiating elements may alternatively different in number and/or arrangement. For example, an array of radiating elements may be arranged in array having M columns and N rows, where M is an integer greater than or equal to zero, and where N is an integer greater than or equal to zero. The radiating element is generally a metal patch configured to communicate signals on a wireless or mobile network, such as 4G and 5G networks. In one example, the radiating elements are arranged to form a phased array of beam-forming antenna elements.

The antenna circuit board 110 generally includes a printed circuit board (PCB) 116 to which at least one chip package 142 is mounted. The PCB can have active and passive electronic and optical devices. The chip package 142 includes at least one integrated circuit (IC) die 112 electrically and mechanically mounted to a package substrate 114. An optionally interposer (not shown) maybe disposed between the IC die 112 and the package substrate 114. The package substrate 114 is electrically and mechanically mounted to the PCB 116 utilizing solder balls (not shown) or other suitable connection.

Although only one chip package 142 having a single IC die 112 is illustrated in FIG. 1, two to as many chip packages 142 as may fit on the PCB 116 may utilized as needed. Additionally the one or more chip packages 142 each may have one IC die 112 to as many IC dies 112 as may fit within each chip package 142 as needed.

The antenna circuit board 110 generally includes passive circuit components (not shown), control circuitry, a power supply, and an array of transceivers. The control circuitry and the array of transceivers may be embodied on the circuitry of the one or more IC dies 112 of the one or more chip packages 142 mounted to the PCB 116.

The control circuitry residing in the IC die(s) 112 is coupled to the power supply and to the transceivers residing in the IC die(s). The control circuitry is also coupled to one or more data ports formed on the PCB 116. The data ports enable the antenna assembly 100 to communicate with an external electronic device, such as a base band unit of a cell site. The control circuitry residing in the IC die 112 also includes processors or other digital logic for processing signals that may be produced and/or received by the antenna array 104.

The power supply is similarly coupled to the control circuitry and to the transceiver. The power supply is also coupled to one or more power ports formed on the PCB 116. The power ports allow the antenna assembly 100 to received power from an external power source, such as a generator or the electrical grid.

The transceivers are coupled to the power supply, the control circuitry and the antenna array 104. The transceivers include circuitry having at least one or more of digital-to-analog converters (DAC), analog-to-digital converters (ADC), filters, modulators and high-performance RF front ends. The RF front ends are coupled to the individual radiating elements of the antenna array.

The exposed surface of the IC die 112 faces the thermal management system 102 and faces way from the package substrate 114. Thermal interface material (TIM) 118 is disposed between the IC die 112 and the thermal management system 102 such that a primary conductive heat transfer path 140 is established from the IC die 112, through the TIM 118 to the thermal management system 102. The TIM 118 may be a thermal gel, thermal epoxy, thermal grease, thermally conductive epoxy, phase-change materials (PCMs), conductive tapes, thermal gap filler (i.e., putty, pad and the like), and silicone-coated fabrics among other suitable materials. The primary conductive heat transfer path 140 is the main route through which heat is removed from the IC die 112 to the thermal management system 102, thus enabling thermal regulation of the chip package 142.

The thermally conductive thermal spreader 122 is disposed in the conductive heat transfer path 140 defined between the IC die 112 to the thermal management system 102 to promote heat transfer. The thermally conductive thermal spreader 122 is generally fabricated from a thermally conductive material. In one example, the conductive thermal spreader 122 is a plate fabricated from a metal, such as copper, aluminum, stainless steel or the like. In the example depicted in FIG. 1, TIM 118 is disposed between and in contact with both the thermally conductive thermal spreader 122 may be disposed in the conductive heat transfer path 140 defined between the IC die 112.

Figure 2:
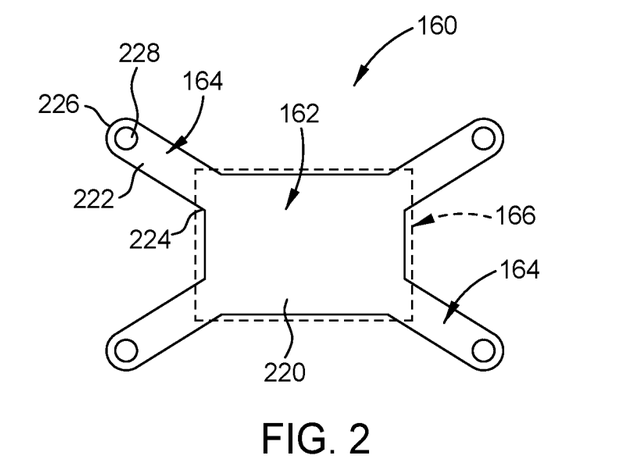
FIG. 2 is a plan view of a bracket utilized in the electronic device of FIG. 1.
Figure 2A:
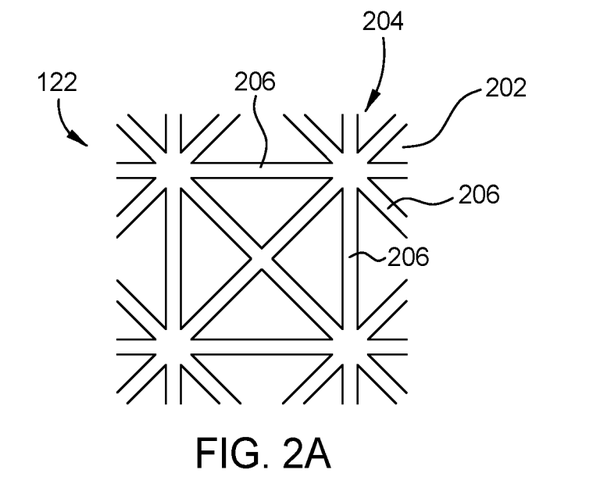
FIG. 2A is a partial plan view of a conductive thermal spreader utilized within the antenna assembly illustrating a textured surface.

FIG. 2A is a partial plan view of a side 202 of the conductive thermal spreader 122 that faces the IC die 112. The side 202 of the conductive thermal spreader 122 is in contact with the TIM 118. The side 202 of the conductive thermal spreader 122 generally includes a textured surface 204. The textured surface 204 has multiple grooves 206 in an otherwise relatively flat surface that forms the side 202 of the thermal spreader 122. In the example depicted in FIG. 2A, the grooves 206 are arranged in rows, columns, and diagonals intersecting with the rows and columns. It is contemplated that the grooves 206 may have other arrangements, such as only rows, only columns, a grid, spirals, waves, or other configurations.

The textured surface 204 is designed, in conjunction with the TIM 118, to push any gas bubbles out of the flat areas present between the thermal spreader 122 and the IC die 112 such that the gas bubbles are trapped in the grooves 206 or driven out of the interface between the thermal spreader 122 and the IC die 112 altogether. The area of the grooves 206 is small relative to the ungrooved areas (i.e., the flat areas) of textured surface 204 such that when the gas bubbles are trapped in the grooved areas, the ungrooved areas of the textured surface 204 transfer heat more effectively. With the area of the regions of the flat portions of the textured surface 204 being substantially greater than the area of the regions for the grooves 206, the textured surface 204 provides lower thermal resistance, increase thermal conductivity, and increase heat transfer from the IC die 112 to the thermal spreader 122 and ultimately to thermal management system 102, which enables better and more reliable performance of the chip package 142.

Figure 2B:
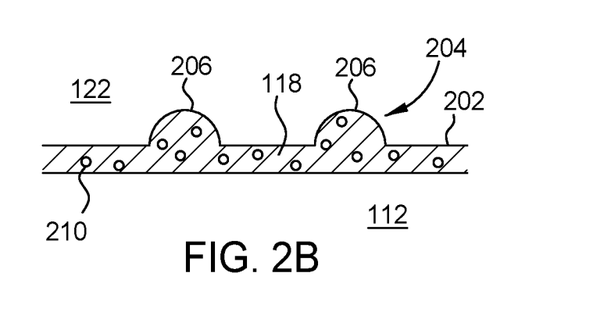
FIG. 2B is a partial sectional view of the textured surface of the conductive thermal spreader of FIG. 2A.

FIG. 2B is a partial sectional view of the side 202 of the conductive thermal spreader 122 interfacing with the TIM 118. In the example depicted in FIG. 3, the TIM 118 includes suspended particles 210. The particles 210 may be a mixture of one or more polymers and metal particles. For some examples, the particles 210 may have a diameter of 25 μm or less.

In one example, the TIM 118 may exhibit physical behaviors characteristic of a phase-change material (PCM). The TIM 118 in the form of a PCM may trap air between the textured surface 204 and the TIM, thereby creating air voids. The particles 210, which displace as the TIM 118 heats, cools, and/or changes phases, move to displace the air voids (e.g., bubbles) into the grooves 206 and out from between the facing flat surfaces of the IC die 112 and the thermal spreader 122, which improves heat transfer between the IC die 112 and the thermal spreader 122, and ultimately improves the performance and reliability of the chip package 142.

Returning to FIG. 1, the thermally conductive thermal spreader 122 has a surface area that is generally larger than the plan area of the IC die 112 so that the area available for thermally conductive contact and the heat transfer is greater between the thermal spreader 122 and the thermal management system 102 than between the thermal spreader 122 and the IC die 112. The increase in surface area on the heat sink-side of the conductive thermal spreader 122 promotes the rate of heat transfer between the IC die 112 and the thermal management system 102 through the conductive heat transfer path 140, thus allowing higher performing IC dies to be utilized without exceeding thermal budgets as compared to conventional designs.

The conductive thermal spreader 122 is clamped, or otherwise urged against the IC die 112 by the first biasing member 152. A plurality of first plurality of first biasing members 152 are shown in FIG. 1. The first biasing member 152 is utilized to urge the conductive thermal spreader 122 against the IC die 112 independent of the force utilized to urge the conductive thermal spreader 122 against the thermal management system 102. In one example, the first biasing member 152 includes a threaded rod or fastener 156 and a spring 154. The fastener 156 is disposed through a clearance hole 174 formed through the PCB 116. The clearance hole 174 allows the fastener 156 to freely pass through the PCB 116. The spring 154 is disposed between a head or other protrusion of the fastener 156 and the PCB 116. The spring 154 may be a coil spring, conical spring washer, a flat spring or other suitable spring-force generating material, such as an elastomer, among others. The opposite end of the fastener 156 is engaged with a threaded termination 170 formed on, in or connected to the thermal spreader 122. The threaded termination 170 may be a threaded boss, threaded hole, nut or other structure suitable to retain the distal end of the fastener 156 to the thermal spreader 122. When the fastener 156 is tightened to move the head of the fastener 156 towards the conductive thermal spreader 122, the spring 154 is compressed and thus generates a force to urge the conductive thermal spreader 122 towards the PCB 116, which consequently causes the conductive thermal spreader 122 to be urged against the IC die 112 with the same force.

In the example depicted in FIG. 1, a bracket 160 is utilized to interface the first biasing member 152 with the PCB 116. Stated differently, the bracket 160 is utilized to transfer the force generated by the first biasing member 152 to the PCB 116.

The bracket 160 has an inner portion 162 and an outer portion 164. The inner portion 162 is aligned over a region 166 defined by the planar extents of the IC die 112 underlying the bracket 160. As such, the inner portion 162 applies the force to area of the PCB 116 that is aligned directly below the IC die 112 so that little or no bending moment is applied to the chip package 142 when the first biasing member 152 urges the spreader 122 against the IC die 112. That is, the force is applied to the IC die 112 is generally aligned from opposite sides of the IC die 112 so that little or no bending moment is generated upon application of the force by the first biasing member 152.

In some examples, the bracket 160 is a spring form, which provides additional control of the force applied by the first biasing member 152. As the first biasing member 152 is engaged with the outer portion 164 of the bracket 160 while the inner portion 162 of the bracket 160 is engaged with the PCB 116, flexing of the bracket 160 when configured as a spring form may be controlled by selecting the material and geometry of the bracket 160. In such examples, the spring 154 may optionally be omitted.

FIG. 2 depicts a plan view of one example of the bracket 160. The inner portion 162 of the bracket 160 that is aligned with the region 166 of the IC die 112 forms the base 220 of the bracket 160. The base 220 may be solid, perforated, or other another geometry. The bracket 160 includes a plurality of legs 222. A proximal end 224 of each leg 222 is coupled to the base 220 of the bracket 160. A distal end 226 of each leg 222 includes a hole 228 to allow the fastener 156 of the first biasing member 152 to pass therethrough. The length and geometry of the leg 222, along with spring constant of the material comprising the bracket 160, controls the spring force generated by the leg 222 once displaced by tightening of the first biasing member 152.

Returning back FIG. 1, one or more bumpers 168 may be utilized between the bracket 160 and PCB 116 to transmit force applied by the bracket 160 within the region 166 above the IC die 112. The bumpers 168 may be a rigid or resilient material. In one example, the bumpers 168 are fabricated from an elastomeric material. In another example, the bumpers 168 are springs, such as a coil spring, conical spring washer, a flat spring or other suitable spring-force generating material. Resilient bumpers 168 prevent excess application of force to the PCB 116. Additionally, resilient bumpers 168 assist in damping motion associated with thermal cycling, resulting in a more uniform and constant application of force between the chip package 142 and the thermal spreader 122 across a greater range of operating temperatures.

Optionally, a thermal gap-filling contact pad 150 may be disposed in the conductive heat transfer path 140 defined between the thermal spreader 122 and the thermal management system 102 to promote heat transfer. The thermal gap-filling contact pad 150 is generally a compressive material having a thermal conductivity greater than about 5 W/m-K (as determined by ASTM D5470). Exemplary thermal gap-filling contact pads 150 are available from Laird Technologies, Inc., and Parker Chomerics, among others. Alternatively, TIM may also be utilized between the thermal spreader 122 and the thermal management system 102 in place of, or in addition to the contact pad 150.

The conductive thermal spreader 122 is also clamped, or otherwise urged against the thermal management system 102 by the at least one second biasing member 134. In the example depicted in FIG. 1, a plurality of biasing members 134 are utilized to urge the PCB 116 towards the thermal management system 102. As the conductive thermal spreader 122 is disposed between the PCB 116 and the thermal management system 102, the PCB 116 consequently urges the thermal spreader 122 against the thermal management system 102. In one example, the biasing member 134 includes a fastener 138 and a spring 136. The spring 136 is disposed between a head or other protrusion of the fastener 138 and the PCB 116. The spring 136 may be fabricated similar to the spring 154 described above. The opposite end of the fastener 138 passes through a hole 176 formed in the PCB 116 and is engaged with a threaded hole 172 formed in the thermal management system 102. When the fastener 138 is tightened to move the head of the fastener 138 towards the thermal management system 102, the spring 136 is compressed and thus generates a force to urge the PCB 116 towards the thermal management system 102, which consequently causes the conductive thermal spreader 122 to be urged against the thermal management system 102 with the same force.

The thermal management system 102 is generally fabricated from a thermally conductive material, such as aluminum, stainless steel, copper or other material suitable for drawing heat away from the IC die 112. The thermal management system 102 also includes at least one or more passive temperature control elements, such as at least one heat pipe 124 and/or fins 126. In the example depicted in FIG. 1, the thermal management system 102 includes a base plate 120 in which the one or more heat pipes 124 are embedded. As noted above, the base plate 120 is generally fabricated from a thermally conductive material, such as aluminum, stainless steel, copper or other suitable material. Although the example depicted in FIG. 1 illustrates a first heat pipe 124 disposed in the base plate 120 with a second heat pipe 124 shown in phantom, as may heat pipes 124 disposed in or on the base plate 120 as desired.

In the example depicted in FIG. 1, the heat pipe 124 is disposed in a channel 144 formed in an interior surface 132 of the base plate 120. The channel 144 may be enclosed, such as in the form of a passage. Alternatively and as shown in FIG. 1, the channel 144 may be may be open, such as in the form of a groove. TIM, brazing material, thermal grease or other heat transfer material may be utilized to fill the interstitial space defined between the channel 144 and the heat pipe 124 to enhance heat transfer between the heat pipe 124 to the base plate 120.

The heat pipe 124 includes a first end 146 that is disposed directly under or even in contact with the thermal spreader 122. A second end 148 of the heat pipe 124 is disposed laterally offset from the lateral extends of the IC die 112. In the example depicted in FIG. 1, the second end 148 of the heat pipe 124 is disposed laterally offset from the thermal spreader 122. Thus, since the first end 146 of the heat pipe 124 is adjacent the thermal spreader 122 and essentially at the end of the heat transfer path 140, the phase change material within the heat pipe 124 efficiently moves the heat transferred from the IC die 112 to the spreader 122 laterally away to cooler regions of the base plate 120 that are laterally spaced from the IC die 112. Thus, the passive cooling provided by the heat pipe 124 substantially increases the capacity of heat transfer away from the chip package 142, thereby allowing the use of a greater number, faster and more powerful electrical devices within the antenna assembly 100 without undesirably having to increase the foot print of the antenna assembly 100.

As mentioned above, the fins 126 also provide passive cooling to the thermal management system 102. The fins 126 are disposed on an exterior surface 130 of the base plate 120 that faces away from the interior surface 132 and the interior volume 108 of the antenna assembly 100. The fins 126 may be generally flat rectangular plates, corrugated, perforated or have another shape.

The fins 126 are formed from a metal or other highly thermally conductive material. For example, the fins 126 may be made stainless steel, aluminum, copper or other suitable material. The fins 126 may be cast with or machined as from a single mass of material with the base plate 120. Alternatively, the fins 126 may be brazed, welded, fastened or otherwise secured to the base plate 120.

Figure 3:
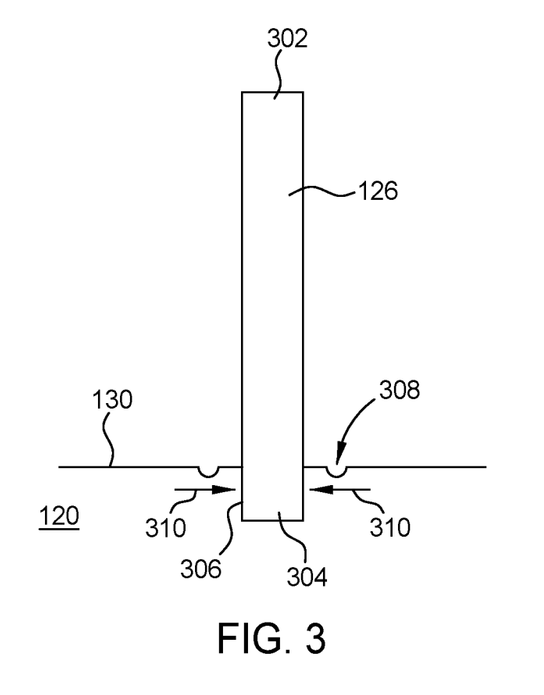
FIG. 3 is an enlarged partial sectional view of a fin extending from a base plate of the thermal management system of FIG. 1.

FIG. 3 is a side view of one embodiment of a fin 126 secured to the base plate 120. The fin 126 includes a distal (first) end 302 and a proximal (second) end 304. The second end 304 is disposed and secured in a slot 306 formed in the surface 130 of the base plate 120. The second end 304 may be secured in the slot 306 by braising, welding, adhesive, press fit or by other suitable techniques. In the example depicted in FIG. 3, the second end 304 is swaged in the slot 306. To swage the second end 304 in the slot 306, the material on the surface 130 adjacent the slot 306 is displaced, for example by forming in impression 308 in the surface 130 immediately adjacent the slot 306. The impression 308 displaces the material of the base plate 120 as shown by arrows 310, thus squeezing the material of the base plate 120 intimately against the second end 304 of the fin 126. The compressive contact of the second end 304 of the fin 126 base intimately against the base plate 120 creates a superior heat transfer interface, that further enhances the ability of the thermal management system 102 to remove heat from the interior volume 108, and beneficially the IC die 112, and promotes increased performance and reliability of the antenna assembly 100.

Returning to FIG. 1, the fins 126 may optionally include surface area extenders 128. The surface area extenders 128 project from the fins 126. In one example, the surface area extenders 128 extend in a direction that is within 45 degrees of perpendicular to a direction that the fin 126 extends from the base plate 120. The surface area extenders 128 are formed from a metal or other highly thermally conductive material. For example, the surface area extenders 128 may be made stainless steel, aluminum, copper or other suitable material. The surface area extenders 128 may be formed from a single mass of material with the fins 126, for example by skiving. Alternatively, the surface area extenders 128 may be brazed, welded, fastened or otherwise secured to the fins 126.

In one embodiment, the surface area extenders 128 are in the form of plates. The plates may be flat, corrugated, perforated, hollow, or have another suitable shape. One example of the surface area extenders 128 is detailed below with reference to FIGS. 4-6.

Figure 4:
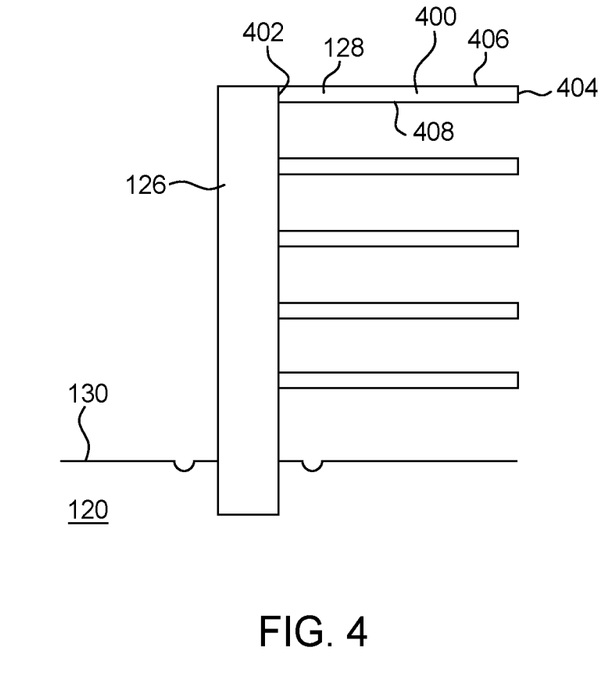
FIG. 4 is a side view of one example of a fin having a plurality of surface area extenders.

FIG. 4 is a side view of one example of a fin 126 having a plurality of surface area extenders 128 coupled thereto. Each surface area extender 128 is in the form of a hollow plate 400. The plate 400 may have rectangular plan area, or have another shape. A first end 402 of the plate 400 is coupled to the fin 126, for example by brazing which promotes heat transfer across the fin-extender interface. A second end 404 of the fin 126 is disposed opposite the first end 402. The plate 400 also has a first side 406 and an opposing second side 408.

Figure 5:
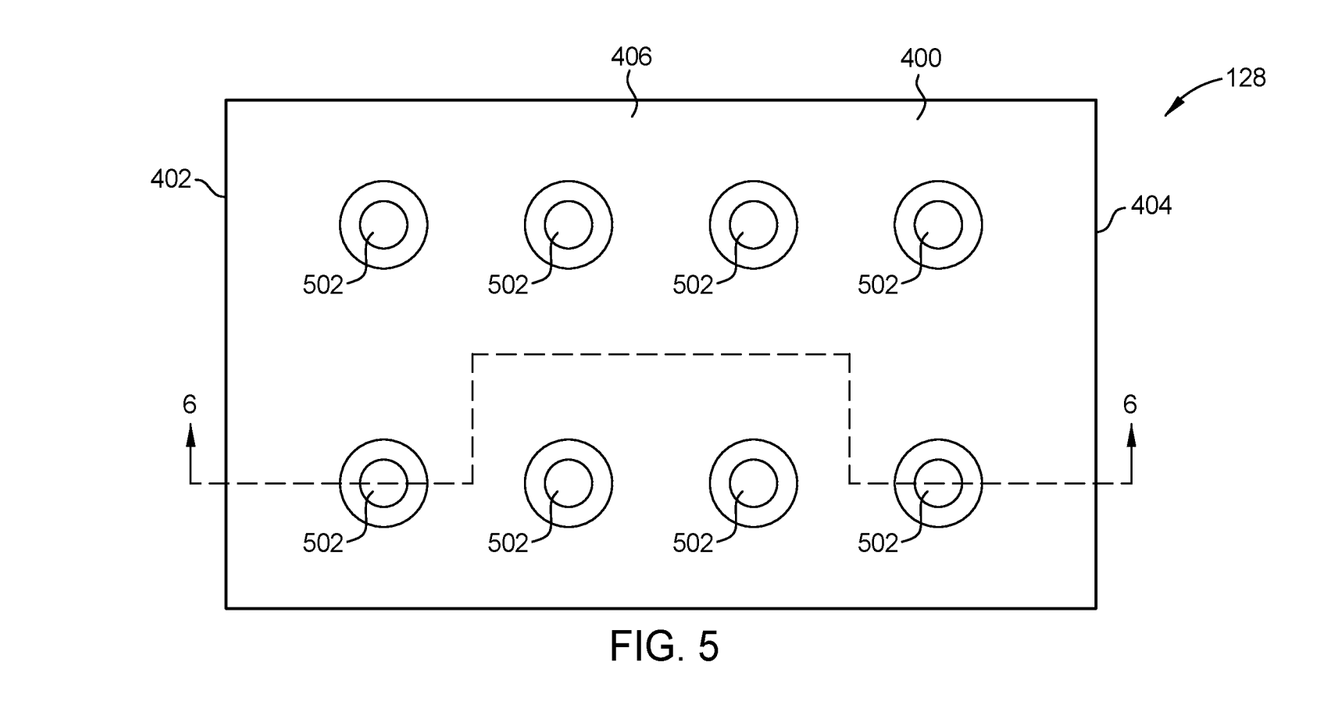
FIG. 5 is a top view of one example of a surface area extender in the form of a hollow plate.
Figure 6:
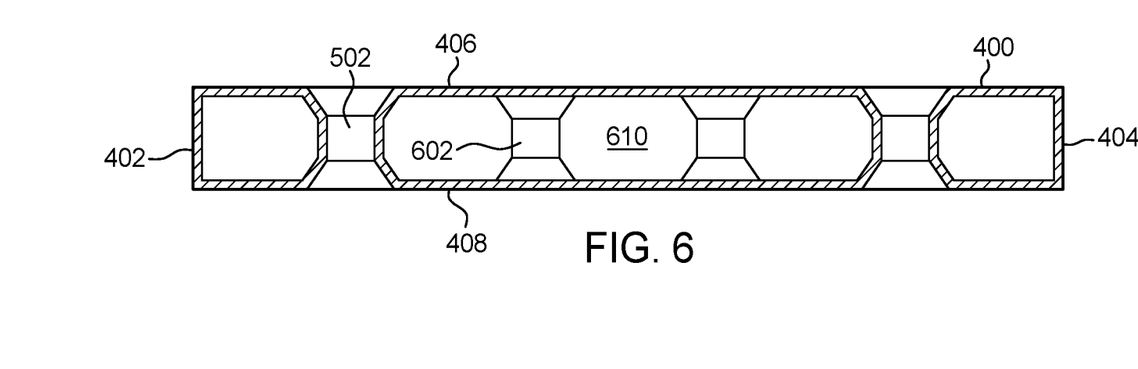
FIG. 6 is a sectional view of the hollow plate taken along section line 6-6 illustrated in FIG. 5.

Referring additionally to the plan view of FIG. 5 and the sectional view of FIG. 6, the plate 400 includes a plurality of perforations 502 extending between the first and second sides 406, 408. The perforations 502 may be arranged in any suitable pattern. In the embodiment of FIG. 5, the perforations 502 are arranged to allow air passage between the plates 400, thus increasing heat transfer efficiency.

The plate 400 is additionally hollow, forming a cavity 610. The cavity 610 is interrupted by tubes 602 through which the perforations 502 are formed such that the cavity 610 remains sealed. The cavity 610 may be filled with a heat conducting or phase change material to further enhance heat dissipation through the plates 400 and fins 126, and away from the thermal management system 102, thus increasing the cooling capacity of the thermal management system 102 and allowing higher performing and high density electronic devices as part of the antenna circuit board 110 and chip packages 142 without the need for increasing the size of the antenna assembly 100.

Figure 7:
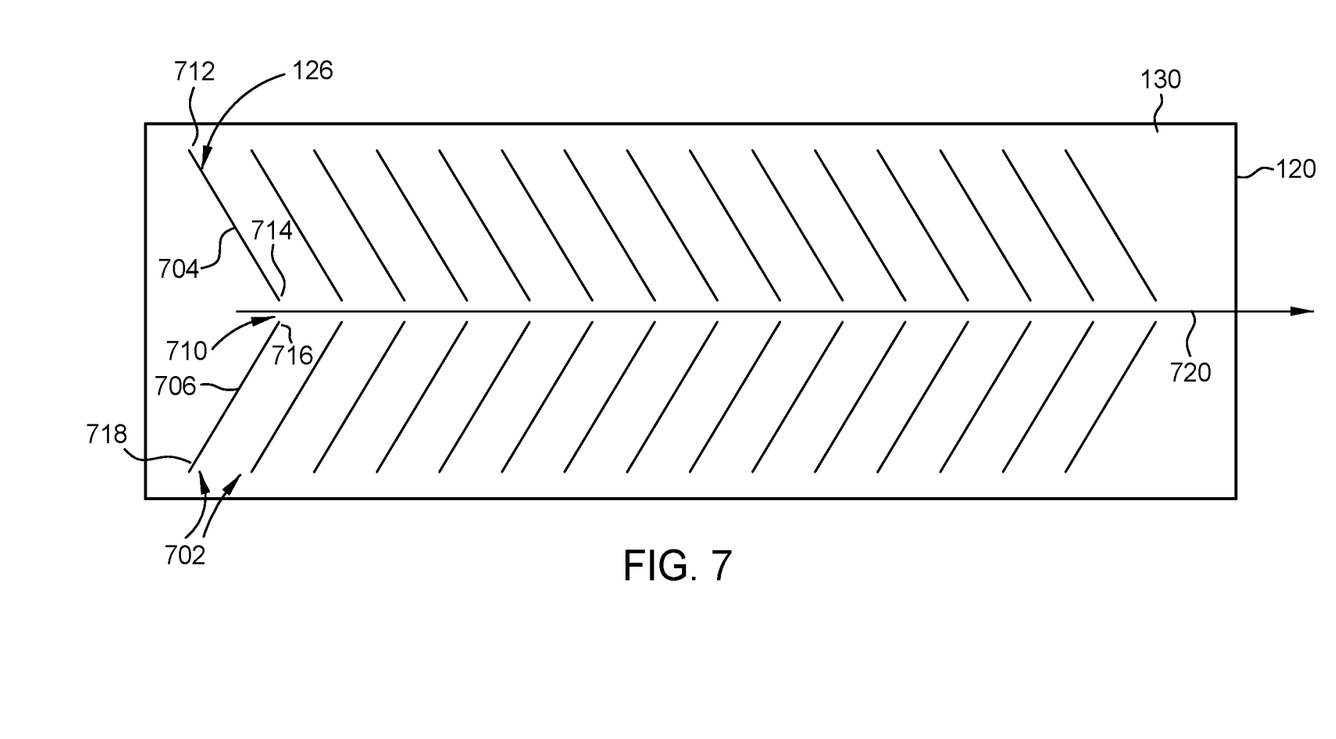
FIG. 7 is a side view of one example of the heat sink having an exemplary arrangement of heat transfer fins.

FIG. 7 is a side view of the exterior surface 130 of the thermal management system 102 of the antenna assembly 100 illustrating one exemplary arrangement of the fins 126. The fins 126 in FIG. 7 are not shown with surface area extenders 128, but surface area extenders 128 may also be utilized as described above. Moreover, the arrangement of the fins 126 in FIG. 7 is exemplary of one embodiment that provides enhanced heat transfer, and other arrangement of the fins 126 are contemplated.

In the example of FIG. 7, the fins 126 are arranged in a plurality of chevron-shaped rows 702. The chevron-shaped rows 702 may be equally spaced, have a repetitive pattern or have other geometry. Each fin 126 comprising one of the rows 702 includes a first section 704 spaced apart from a second section 706. The sections 704, 706 form the opposite sides of the chevron shape. In one example, the first section 704 is the mirror image of the second section 706. The sections 704, 706 have a passage 710 defined therebetween. The passage 710 may be a tunnel, groove or other gap formed between the sections 704, 706 of the fin 126.

In one example, the first section 704 includes an outer end 712 and an inner end 714. Similarly, the second section 706 includes an outer end 718 and an inner end 716. The inner ends 714, 716 are disposed adjacent each other and are separated to form the passage 710. The passages 710 of adjacent fins 126 forming the rows 702 defined an air channel (illustrated by arrow 720). The chevron shape of the fins 126, in conjunction with the passage 710 formed at the vertices of the chevrons, functions to displace heated air from the center of the chevrons toward the outer ends 712, 718 of the fins 126, while drawing cooler air into the center of the chevrons through the air channel 720 formed by the passages 710. The air movement created by the chevron-shaped rows 702 of fins 126 further functions to increase the rate of heat transfer from the thermal management system 102, which as a corresponding improvement to the performance, speed, and reliability of the antenna assembly 100, thus allowing more powerful and faster performing components without a corresponding increase in size, cost or need for incorporation of active temperature control elements.

Figure 8:
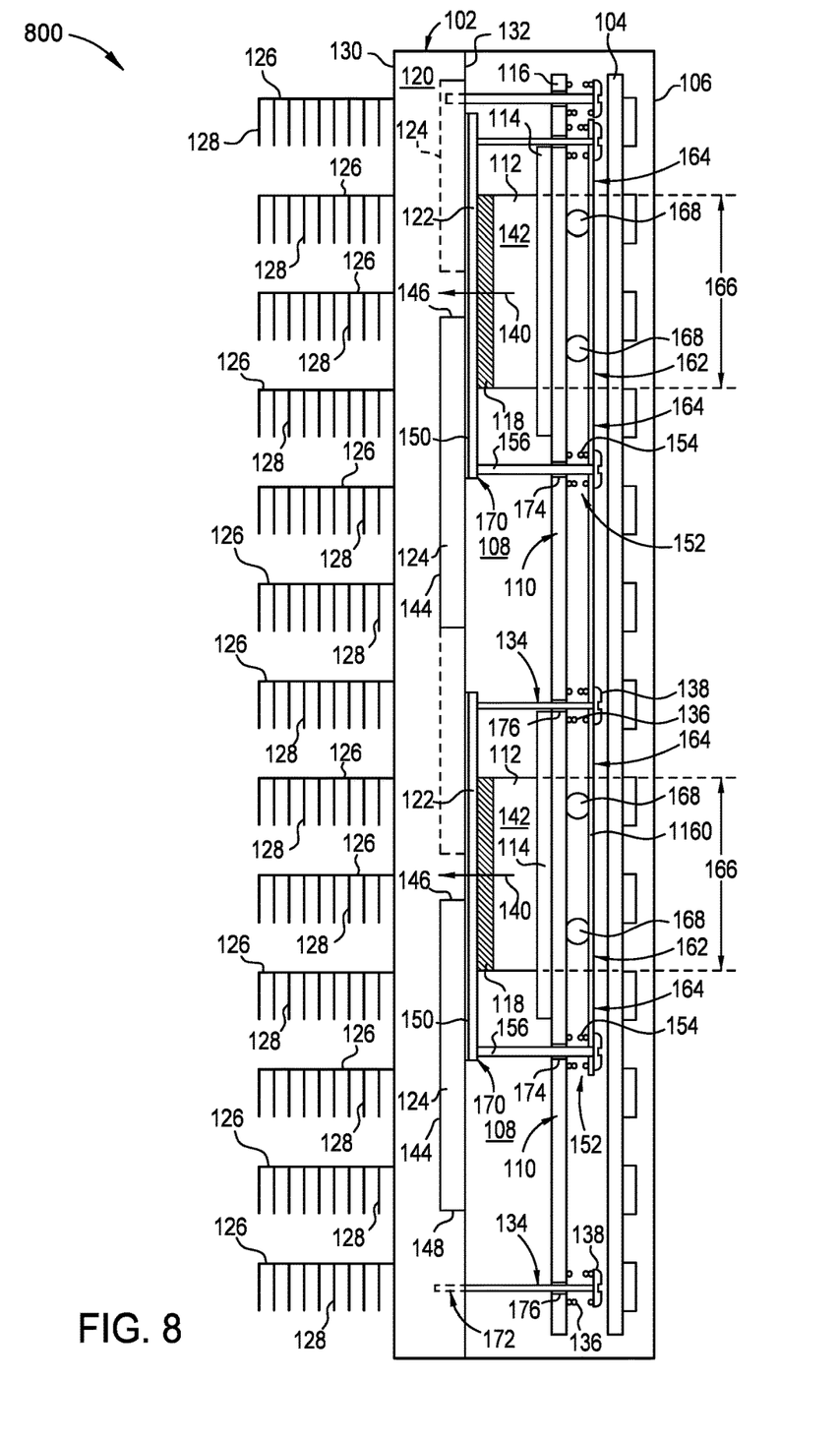
FIG. 8 is a schematic sectional view of another electronic device having a chip packages interfaced with force balanced temperature control elements.

FIG. 8 is another embodiment of an electronic device 800. The electronic device 800 may be in the form of an antenna assembly, among other electronic devices. The electronic device 800 is similar to the electronic device 100 depicted in FIG. 1 and described above, except wherein the electronic device 800 includes a plurality of chip packages 142, at two of which have force applied thereto through a common bracket 1160. The first biasing members 152 are interfaced with the bracket 1160 to control the force applied by the thermal spreaders 122 to the dies 112 of the chip packages 142. Thus, the bracket 1160 interfaces though the first biasing members 152 with different thermal spreaders 122 respectively associated with different chip packages 142. It is contemplated at additional brackets 1160 (not shown) may be utilized with other dies 112 of chip packages 142 within the electronic device 800. It is also contemplated as shown in FIG. 8 that all the chip packages 142 within the electronic device 800 may be interfaced with a single bracket 1160.

Figure 9:
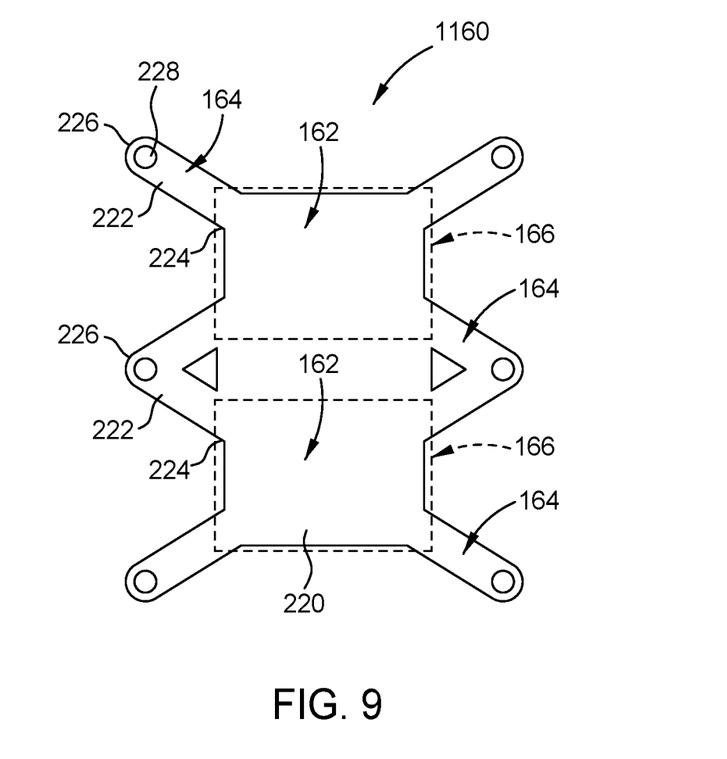
FIG. 9 is a plan view of a bracket utilized in the electronic device of FIG. 8.

FIG. 9 depicts a plan view of one example of the bracket 1160. The bracket 1160 is constructed similar to the bracket 160 described above, except wherein the inner portion 162 that forms the base 220 of the bracket 1160 is aligned with separate regions 166 of IC dies 112 in different chip packages 142. The base 220 may be solid, perforated, or other another geometry. The base 220 may segmented between regions 166. Optionally, a segmented base 220 may be coupled by one or more of the legs 222, or other connecting strip of material. As with the legs 222 of the bracket 160, a proximal end 224 of each leg 222 is coupled to the base 220 of the bracket 1160. A distal end 226 of each leg 222 includes a hole 228 to allow the fastener 156 of the first biasing member 152 to pass therethrough. The length and geometry of the leg 222, along with spring constant of the material comprising the bracket 1160, controls the spring force generated by the leg 222 once displaced by tightening of the first biasing member 152. In the embodiment depicted in FIG. 9, the bracket 1160 includes a leg 222 with a hole 228 between each region of the base 220 that is aligned with one of the regions 166. In this manner, the force applied to each chip package 142 may be effectively set while using a single bracket 1160.

Thus, examples of electronic devices have been described above that balance forces applied to temperature control elements interfaced with a chip package, thus enabling stress present in the chip package to be effectively managed. Managing stress applied to the chip package improves the reliability and service life of routings and solder connections of the chip package, accordingly resulting in a robust and reliable electronic device.

The examples provided above are particularly suitable for improving the performance and reliability of antenna assemblies. Additionally, the balanced force application allows thermal management systems and the thermal spreaders to provide enhanced temperature management of solid state components within the electronic devices. Advantageously, the efficient temperature management allows for the use of a large number electrical components within the antenna assembly, thus enabling greater processing speeds and ultra-low latency without the need for large thermal management systems as would be required in conventional devices. Thus, the efficient thermal management enables robust and reliable performance of massive-element antennas utilized by next generation (e.g., 5G) mobile communication devices without a corresponding need for increase antenna assembly footprint or cost. Moreover, the improved thermal management of the active components and circuits of the antenna assembly allow for a more compact antenna design, thus enabling a smaller and more desirable antenna footprint, while making cooling simpler and improving the service life.

While the foregoing is directed to embodiments of the present invention, other and further embodiments of the invention may be devised without departing from the basic scope thereof, and the scope thereof is determined by the claims that follow.

What is claimed is:

1. An electronic device comprising:
a printed circuit board (PCB);
a chip package having a first side electrically and mechanically mounted to the PCB;
a thermal management system disposed on a second side of the chip package;
a thermal spreader disposed between the second side of the chip package and the thermal management system;
a first biasing member engaged between the thermal spreader and the PCB, the first biasing member configured to control a first force sandwiching the chip package between the thermal spreader and the PCB;
a second biasing member engaged between the thermal management system and the PCB, the second biasing member configured to control a second force applied by the thermal management system against the thermal spreader;
an antenna array coupled to the chip package; and
a radome enclosing a volume in which the antenna array and the chip package are disposed.

2. The electronic device of claim 1 further comprising:
a bracket configured to transmit the first force from the first biasing member to the PCB.

3. The electronic device of claim 2, wherein the bracket is a spring form.

4. The electronic device of claim 3, wherein the bracket has a flexible leg and a base, the base aligned over the chip package, the leg extending outward from the base to a distal end disposed laterally beyond the chip package, the distal end of the leg engaged with the first biasing member, the base configured to transmit force applied to the leg to the chip package.

5. The electronic device of claim 2, wherein the bracket comprises:
a plurality of bumpers disposed in contact with the PCB.

6. The electronic device of claim 5, wherein the bumpers are aligned over the chip package.

7. The electronic device of claim 1, wherein the first biasing member further comprises:
a first rod extending freely through the PCB;
a first spring captured by the first rod and configured to apply the first force to the PCB.

8. The electronic device of claim 7, wherein the second biasing member further comprises:
a second rod extending freely through the PCB;
a second spring captured by the second rod and configured to apply the second force to the thermal spreader.

9. An electronic device comprising:
a printed circuit board (PCB) having a first side and a second side;
a chip package having a first side electrically and mechanically mounted to the second side of the PCB;
a thermal management system disposed on a second side of the chip package;
a thermal spreader disposed between the second side of the chip package and the thermal management system;
a bracket disposed in contact with the first side of the PCB, the bracket having a first portion aligned over the chip package and a second portion disposed laterally outward of the chip package;
a plurality of first biasing members disposed freely through the PCB and engaged with the second portion of the bracket and the thermal spreader, the plurality of first biasing members configured to apply a first force sandwiching the chip package between the thermal spreader and the PCB;
a plurality of second biasing members engaged between the thermal management system and the PCB, the second biasing members configured to control a second force applied by the thermal management system against the thermal spreader;
an antenna array coupled to the chip package; and
a radome enclosing a volume in which the antenna array and the chip package are disposed.

10. The electronic device of claim 9 wherein the bracket is configured to transmit the first force from the first biasing member to the PCB.

11. The electronic device of claim 9, wherein the bracket is a spring form.

12. The electronic device of claim 11, wherein the second portion of the bracket includes flexible legs engaged with the first biasing members.

13. The electronic device of claim 9, wherein the bracket comprises:
a plurality of bumpers disposed in contact with the PCB.

14. The electronic device of claim 13, wherein the bumpers are aligned over the chip package.

15. An electronic device comprising:
a thermal management system;
a printed circuit board (PCB);
a thermal spreader;
an antenna array;
a chip package having a conductive primary heat dissipation path through the thermal spreader to the thermal management system;
a radome disposed over the antenna array and forming part of a housing that encloses the antenna array and the chip package;
a plurality of first biasing members disposed freely through the PCB and engaged with the thermal spreader, the plurality of first biasing members configured to apply a first force sandwiching the chip package between the thermal spreader and the PCB; and
a plurality of second biasing members engaged between the thermal management system and the PCB, the second biasing members configured to control a second force applied by the thermal management system against the thermal spreader.

16. The electronic device of claim 15 further comprising:
a flexible spring form configured to transmit the first force from the first biasing members to the PCB.

17. The electronic device of claim 16 further comprising:
at least a first compressive bumper disposed in contact with the PCB and the spring form, the first compressive bumper aligned over the chip package.

18. The electronic device of claim 16, wherein the plurality of first biasing members is configured to be adjusted to change the first force without changing the second force.

* * * * *